US012476085B2

(12) United States Patent
Colvin et al.

(10) Patent No.: US 12,476,085 B2
(45) Date of Patent: Nov. 18, 2025

(54) SHIELDED GAS INLET FOR AN ION SOURCE

(71) Applicant: Axcelis Technologies, Inc., Beverly, MA (US)

(72) Inventors: Neil K. Colvin, Merrimack, NH (US); Neil Bassom, Hamilton, MA (US); Joshua Abeshaus, Salem, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 426 days.

(21) Appl. No.: 17/976,055

(22) Filed: Oct. 28, 2022

(65) Prior Publication Data

US 2023/0135525 A1 May 4, 2023

Related U.S. Application Data

(60) Provisional application No. 63/273,338, filed on Oct. 29, 2021.

(51) Int. Cl.
*H01J 37/32* (2006.01)

(52) U.S. Cl.
CPC .... *H01J 37/32412* (2013.01); *H01J 37/3244* (2013.01); *H01J 37/32651* (2013.01); *H01J 37/32724* (2013.01)

(58) Field of Classification Search
CPC ............. H01J 37/32412; H01J 37/3244; H01J 37/32651; H01J 37/32724
See application file for complete search history.

(56) References Cited

U.S. PATENT DOCUMENTS

| | | | |
|---|---|---|---|
| 5,969,470 A | 10/1999 | Druz et al. | |
| 6,847,043 B2 | 1/2005 | Murrell et al. | |
| 9,741,537 B1 | 8/2017 | Kao et al. | |
| 10,418,223 B1 | 9/2019 | Chaney et al. | |
| 11,127,557 B1 | 9/2021 | Koo et al. | |
| 11,170,967 B2 | 11/2021 | Bassom et al. | |
| 2021/0383995 A1* | 12/2021 | Koo | H01J 27/024 |

FOREIGN PATENT DOCUMENTS

| | | |
|---|---|---|
| JP | H11238485 A | 8/1999 |
| JP | 4256142 B2 | 4/2009 |
| WO | 2020197938 A1 | 10/2020 |

OTHER PUBLICATIONS

International Search Report dated Feb. 27, 2023 in connection with PCT/US2022/048194.

* cited by examiner

*Primary Examiner* — Nicole M Ippolito
(74) *Attorney, Agent, or Firm* — Eschweiler & Potashnik, LLC

(57) ABSTRACT

An ion source has arc chamber having one or more radiation generating features, an arc chamber body enclosing an internal volume, and at least one gas inlet aperture defined therein. A gas source provides a gas such as a source species gas or a halide through the gas inlet aperture. The source species gas can be an aluminum-based ion source material such as dimethylaluminum chloride (DMAC). One or more shields positioned proximate to the gas inlet aperture provide a fluid communication between the gas inlet aperture and the internal volume, minimize a line-of-sight from the one or more radiation generating features to the gas inlet aperture, and substantially prevent thermal radiation from reaching the gas inlet aperture from the one or more radiation generating features.

29 Claims, 9 Drawing Sheets

SHIELDED GAS INLET FOR AN ION SOURCE

REFERENCE TO RELATED APPLICATIONS

This application claims the benefit of U.S. Provisional Application Ser. No. 63/273,338 filed Oct. 29, 2021, entitled, "SHIELDED GAS INLET FOR AN ION SOURCE", the contents of all of which are herein incorporated by reference in their entirety.

FIELD

The present invention relates generally to ion implantation systems, and more specifically to an ion source for an ion implantation system configured to generate an ion beam, whereby a gas inlet for introducing a source gas to the ion source is shielded to mitigate a degradation of source materials at high temperatures, such as when forming aluminum ions from gaseous dimethylaluminum chloride (DMAC).

BACKGROUND

There is increasing demand for ion implants using metal ions. For example, aluminum implants are important for the power device market, which is a small but fast-growing segment of the market. For many metals, including aluminum, supplying feed material to the ion source is problematic. Systems have been previously provided that utilize a vaporizer, which is a small oven that is external to the arc chamber of the ion source, whereby metal salts are heated to produce adequate vapor pressure to supply vapor to the ion source. The oven, however, is remote from the arc chamber and takes time to heat up to the desired temperature, establish the vapor flow, start the plasma, start the ion beam, etc. Further, if a change from one metal species to some other species is desired, time is taken in waiting for the oven to cool down adequately for such a change in species.

Another conventional technique is to place a metal-containing material such as aluminum or another metal inside the arc chamber. For aluminum, the metal-containing material may comprise aluminum oxide, aluminum fluoride, or aluminum nitride, all of which can withstand the approximately 800 C temperatures of the plasma chamber. In such a system, ions are sputtered directly off the material in the plasma. Another technique is to use a plasma containing an etchant such as fluorine to attain chemical etching of the metal. While acceptable beam currents can be attained using these various techniques, compounds of aluminum oxide, aluminum chloride, and aluminum nitride, all of which are good electrical insulators, tend to be deposited on electrodes adjacent to the ion source in a relatively short period of time (e.g., 5-10 hours). As such, various deleterious effects are seen, such as high voltage instabilities and associated variations in dosage of ions being implanted.

SUMMARY

The present disclosure thus provides a system and apparatus for generating an ion beam when utilizing a thermally unstable gas, such as forming an ion beam comprising ions from gaseous dimethylaluminum chloride (DMAC), diborane, or other gases. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, an ion implantation system is provided. Broadly, the disclosure is directed toward an ion implantation and ion source for implantation of ions. In one particular example, a thermally unstable gas such as a gaseous aluminum-based ion source material is provided, wherein an ion source is configured to receive and ionize the gaseous aluminum-based ion source material and to form an ion beam therefrom. A beamline assembly is configured to selectively transport the ion beam, and an end station is configured to accept the ion beam for implantation of ions into a workpiece.

The gaseous aluminum-based ion source material, for example, comprises, or is comprised of, dimethylaluminum chloride (DMAC). In one example, the DMAC is stored as a liquid that transitions into vapor phase at room temperature when under vacuum. A pressurized gas bottle, for example, is configured to contain the DMAC and to provide the DMAC to the ion source. The ion source, for example, comprises an arc chamber, wherein the pressurized gas bottle is configured provide the DMAC to the arc chamber. One or more dedicated supply lines can be further provided and configured to transfer the DMAC from the pressurized gas bottle to the arc chamber. A low-pressure gas bottle, for example, is configured to contain the DMAC and to provide the DMAC to an arc chamber of the ion source as a gas via a primary gas line.

In accordance with some examples of the present disclosure, an ion source is provided, wherein an arc chamber has one or more radiation generating features defined therein. The arc chamber, for example, comprises an arc chamber body generally enclosing an internal volume. The arc chamber, for example, has at least one gas inlet aperture defined therein. One or more shields, for example, are positioned proximate to the gas inlet aperture. The one or more shields, for example, provide a fluid communication between the gas inlet aperture and the internal volume. The one or more shields are further configured to substantially prevent thermal radiation from reaching the gas inlet aperture from the one or more radiation generating features.

In accordance with various aspects of the disclosure, an ion source is provided, wherein an arc chamber has one or more radiation generating features defined therein. The arc chamber comprises an arc chamber body generally enclosing an internal volume, wherein the arc chamber body has a gas inlet aperture defined therein. A gas source, for example, is configured to provide a gas through the gas inlet aperture, and one or more shields are positioned proximate to the gas inlet aperture. In one example, the gas comprises dimethylaluminum chloride (DMAC).

The one or more shields, for example, provide a fluid communication between the gas inlet aperture and the internal volume, wherein the one or more shields minimize a line-of-sight from the one or more radiation generating features to the gas inlet aperture and are configured to substantially prevent thermal radiation from reaching the gas inlet aperture from the one or more radiation generating features.

The gas inlet temperature, for example, can be defined at the gas inlet aperture, wherein the one or more shields are configured to maintain the gas inlet temperature below a predetermined maximum temperature, and wherein the predetermined maximum temperature is based on a decomposition temperature of the gas. In another example, the ion source is configured to form a plasma within the arc chamber from a source material comprising a dopant species. At least one shield of the one or more shields, for example, can be comprised of a shield material that comprises the dopant species, wherein the shield material is configured to be chemically etched by the gas. The dopant species, in one example, comprises aluminum, wherein the gas comprises a halide. In another example, the one or more shields comprise a plurality of shields, wherein the at least one shield comprises a closest one of the plurality of shields that is in closest proximity to the gas inlet aperture and is comprised of the dopant species, and wherein a farthest one of the plurality of shields that is farthest from the gas inlet aperture is comprised of a refractory metal, a ceramic, or graphite.

The one or more radiation generating features, for example, can comprise one or more of a plasma column defined within the internal volume, a cathode, a repeller, the arc chamber body, and an arc slit plate. The one or more shields, for example, are configured to generally prevent the plasma column from forming a plasma at the gas inlet aperture.

In accordance with another example, the one or more shields comprise a plurality of rigid plates in a stacked formation. The plurality of rigid plates, for example, are positioned directly over the gas inlet aperture while not contacting the gas inlet aperture. The arc chamber body, for example, can further comprise one or more liners, wherein the plurality of rigid plates are recessed behind an innermost liner and the arc chamber body. The plurality of rigid plates, for example, can be spaced apart from each other by a predetermined spacing distance.

In another example, the one or more shields are comprised of a plurality of shields, wherein one or more of the plurality of shields have one or more shield apertures defined therein. The one or more shield apertures, for example, are defined in the two or more of the plurality of shields and are offset from one another, thereby preventing the line-of-sight from the one or more radiation generating features to the gas inlet aperture through the one or more shield apertures.

The one or more shields, for example, are symmetrically arranged with respect to the arc chamber body. In yet another example, the one or more shields are comprised of one or more a refractory material, a ceramic, and graphite.

In another example, the arc chamber body comprises one or more liners, and wherein the one or more shields are operably coupled to the one or more liners. The one or more liners, for example, can comprise one or more thermal breaks defined therein, wherein the one or more thermal breaks are configured to reduce a heat transfer to the gas inlet aperture. The one or more thermal breaks, for example, can comprise one or more of a groove defined in the one or more liners, a region of the one or more liners that has a smaller cross section than a remainder of the one or more liners, and a machined periphery defined around the gas inlet aperture configured to limit a thermal conduction through the one or more liners to the gas inlet aperture.

One or more fastening devices can be further provided, wherein the one or more fastening devices, for example, operably couple the one or more shields to one or more of the arc chamber body and the one or more liners. The one or more fastening devices, for example, comprise one or more screws and/or one or more standoffs. In another example, a plurality of slots are defined in the one or more liners, wherein the one or more shields are configured to slidingly engage the plurality of slots, thereby operably coupling the one or more shields to the one or more liners.

In accordance with another example, an ion source is provided, wherein an arc chamber is configured to form a plasma column. A gas inlet aperture, for example, is defined in a wall of the arc chamber, and one or more shields are provided, wherein the one or more shields generally prevent a line of sight from the plasma column to the gas inlet aperture. The one or more shields, for example, generally define one or more walls of the arc chamber.

In another example, the ion source further comprises a cathode and a repeller respectively positioned at opposite ends of the arc chamber, wherein the arc chamber is symmetrical, and whereby the one or more shields are configured to provide a uniform erosion of the cathode and repeller.

The one or more shields, for example, are further configured to lower a temperature proximate to the gas inlet aperture concurrent with the formation of the plasma column. In another example, the one or more shields further minimize a decomposition and/or plugging of the gas inlet aperture concurrent with the formation of the plasma column.

According to another example, one or more of a size, a shape, and a quantity of the one or more shields is configured to prevent the line of sight from the plasma column to the gas inlet aperture based, at least in part, on a temperature sensitivity of a gas provided through the gas inlet aperture. For example, the one or more shields are configured to reduce a temperature of the arc chamber concurrent with the formation of the plasma column.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
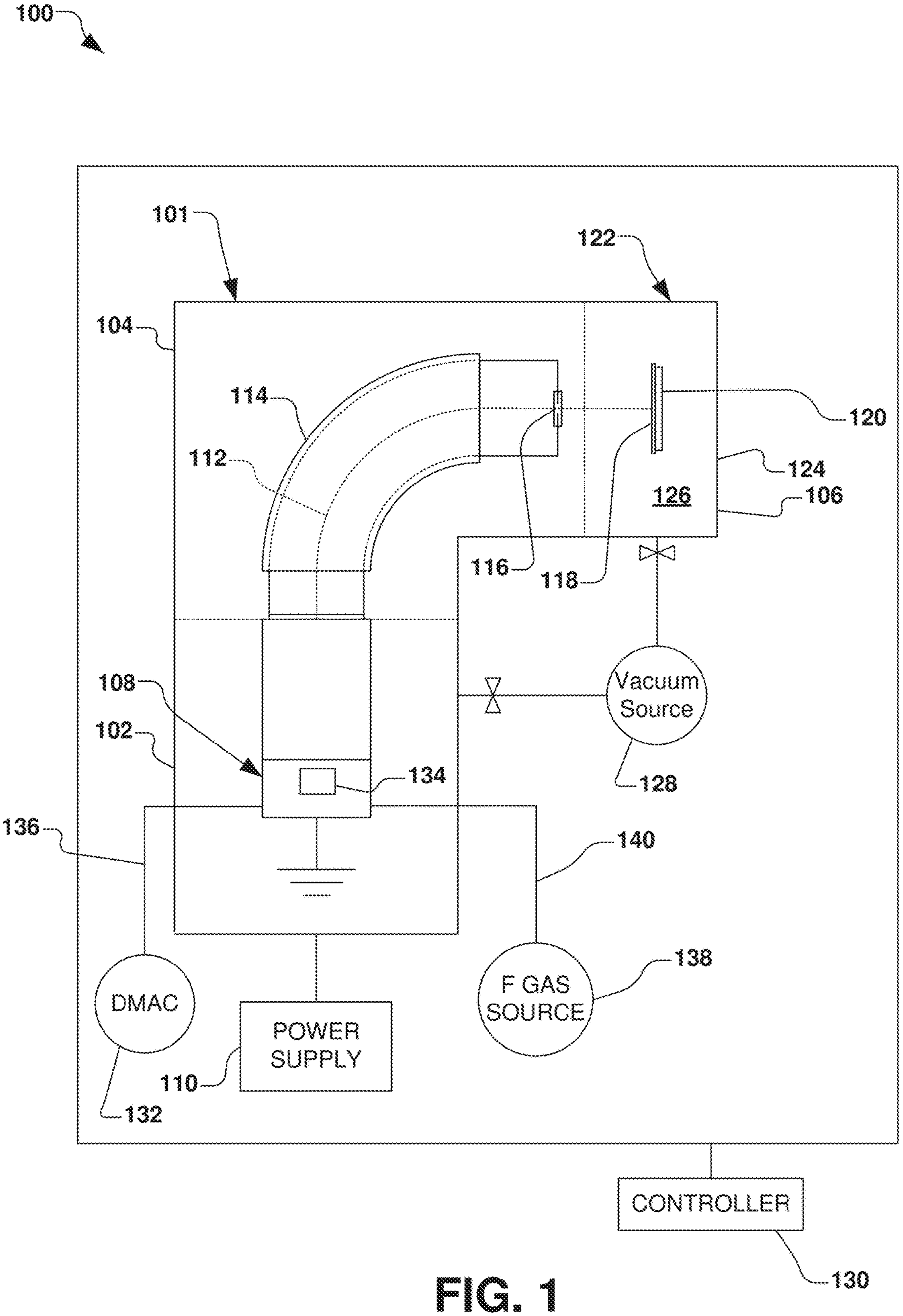
FIG. 1 is a block diagram of an exemplary vacuum system in accordance with several aspects of the present disclosure.

The present disclosure is directed generally toward an ion implantation system and an ion source material associated therewith. More particularly, the present disclosure is directed toward components for said ion implantation system when using a gas that is highly reactive and/or thermally unstable, whereby high temperatures within an ion source increase a reactivity or reaction rate of the gas. For example, an ion source material is provided as a source gas for producing atomic ions to electrically dope silicon, silicon carbide, or other semiconductor substrates at various temperatures. In particular, the present disclosure advantageously minimizes degradation of such a source gas at high temperatures, such as when using dimethylaluminum chloride (DMAC) as the ion source material. Further, when using a highly reactive gas such as fluorine, by achieving a lower temperature at a gas inlet of the ion source in accordance with the present disclosure, a reduction of an etch rate of components adjacent to, or in contact with, the gas inlet is further achieved, such as in a case where $NF_3$ is utilized, whereby its decomposition into nitrogen and fluorine is reduced.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, or other physical or functional units shown in the drawings or described herein could also be implemented by an indirect connection or coupling. Furthermore, it is to be appreciated that functional blocks or units shown in the drawings may be implemented as separate features in one embodiment, and may also or alternatively be fully or partially implemented in a common feature in another embodiment. For example, several functional blocks may be implemented as software running on a common processor, such as a signal processor.

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules from an ion source of an ion implanter are ionized, accelerated, formed into an ion beam, analyzed, and swept across a wafer, or the wafer is translated through the ion beam. The dopant ions physically bombard the wafer, enter the surface and come to rest below the surface, at a depth related to their energy.

Ion sources in ion implanters typically generate the ion beam by ionizing a source material in an arc chamber, wherein a component of the source material is a desired dopant element. The desired dopant element is then extracted from the ionized source material in the form of the ion beam.

In order to gain a general understanding of the disclosure, and in accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110 to ionize a dopant gas into a plurality of ions from the ion source to form an ion beam 112. Individual electrodes in close proximity to the extraction electrode may be biased to inhibit back streaming of neutralizing electrons close to the source or back to the extraction electrode.

The ion beam 112 in the present example is directed through a beam-steering apparatus 114, and out an aperture 116 towards the end station 106. In the end station 106, the ion beam 112 bombards a workpiece 118 (e.g., a semiconductor such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber. Further, a controller 130 is provided for overall control of the vacuum system 100.

The present disclosure appreciates that workpieces 118 having silicon carbide-based devices formed thereon have been found to have better thermal and electrical characteristics than silicon-based devices, and in particular, in applications used in high voltage and high temperature devices, such as electric cars, etc. Ion implantation into silicon carbide, however, utilizes a different class of implant dopants than those used for silicon workpieces. In silicon carbide implants, aluminum, phosphorous, and nitrogen implants are often performed. Nitrogen implants, for example, are relatively simple, as the nitrogen can be introduced as a gas, and provides relatively easy tuning, cleanup, etc. Aluminum, however, is more difficult, as there are presently few good gaseous solutions of aluminum known.

The present disclosure contemplates that an ion source material 132, for example, is provided to an arc chamber 134 of the ion source 108 for forming the ion beam 112. Heretofore, there has been no materials that could be safely and effectively delivered to the ion source 108 in a gaseous form in order to produce the ion beam 112 for subsequent implantation of aluminum ions. In the past, either a solid source material (not shown) has been placed in a heated vaporizer assembly (not shown), whereby the resulting gas is fed into the arc chamber 134, or a solid high-temperature ceramic (not shown) such as $Al_2O_3$ or AlN has been placed into the arc chamber where it is etched by a fluorine-based gas.

Both of these techniques, however, can have substantial limitations. For example, the time for a vaporizer to achieve a temperature needed to transition the solid material into a vapor phase can be greater than 30 minutes, thus impacting tool productivity. Further, when a different dopant gas is desired to be introduced into the arc chamber, the time needed to subsequently reduce the temperature of the vaporizer such that the source material is no longer in a vapor phase can be greater than 30 minutes. This is commonly referred to as the transition time between species, whereby the transition time can reduce the productivity of the ion implanter.

Still further, when etching an aluminum oxide ($Al_2O_3$) or aluminum nitride (AlN) ceramic using a fluorine-based dopant gas (e.g., $BF_3$, $NF_3$, $PF_3$, $PF_5$), the resulting by-products of the reaction (e.g., $AlF_x$, Al, N and neutrals of AlN and $AL_2O_3$) can form an insulating coating on the extraction electrode (e.g., at a negative voltage), which, in turn, can cause a charge build up and subsequent discharging to an ion source arc slit optics plate (e.g., at a positive voltage), thus further reducing the productivity of the tool.

In order to overcome the limitations or the prior art, the ion implantation system 101 of the present disclosure provides gaseous dimethylaluminum chloride ($C_4H_{10}AlCl$, also referred to as DMAC) as the ion source material 132 to advantageously deliver an aluminum-based material into the arc chamber 134 of the ion source 108 in a gaseous form. Providing DMAC to the arc chamber 134 in a gaseous form, for example, advantageously allows for faster transition times between species (e.g., less than 5 minutes), no wait times for material warm-up and cool-down, and no insulating material forming on the extraction electrode seen in conventional systems. The ion source material 132 (e.g., DMAC), for example, is selectively delivered to the arc chamber 134 via a dedicated, primary gas line 136, as it is a highly reactive material (pyrophoric). A fluorine-containing gas source 138 (e.g., $BF_3$, $PF_3$, etc.) is selectively provided to the arc chamber 134 via a secondary gas line 140, wherein the primary gas line 136 and secondary gas line are distinct and separate gas lines. The fluorine-containing gas source 138, for example, is a molecule or a pre-mixture of gases wherein at least one component thereof is fluorine.

Figure 2:
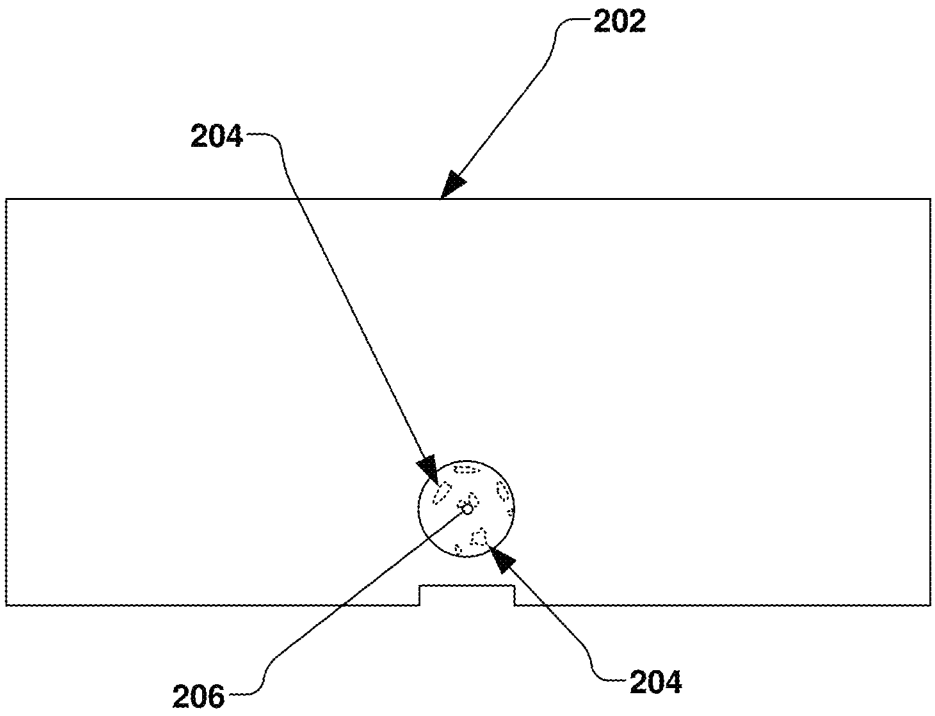
FIG. 2 is a front view of a conventional gas inlet to an arc chamber having a buildup of material plugging the gas inlet.

Using a gas such as DMAC as a source material to generate an aluminum ion beam has benefits in terms of fast transitions and stability of the ion source; however, exposure of the DMAC gas to temperatures greater than 400 C will tend to decompose the DMAC. FIG. 2, for example, illustrates a sidewall 202 of a conventional arc chamber of an ion source, where contamination 204 can form at a gas inlet channel 206 utilized to introduce the DMAC gas to the arc chamber, whereby the gas inlet channel is conventionally exposed to high temperatures (e.g., greater than 400 C) within the arc chamber, and wherein the gas inlet channel can become plugged or otherwise contaminated with the decomposed DMAC.

Figure 3:
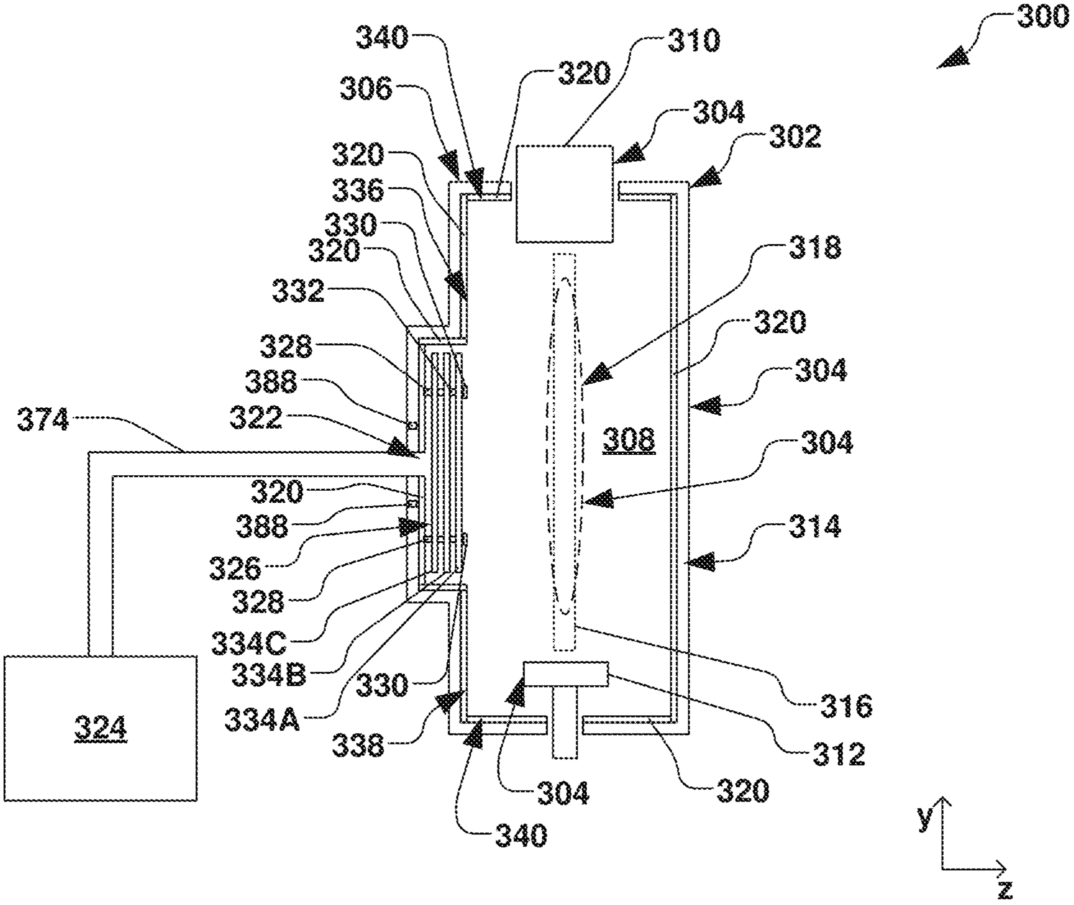
FIG. 3 is a schematic representation of an ion source in accordance with several example aspects of the present disclosure.

Accordingly, the present disclosure provides a number of apparatuses, systems, and methods for generally preventing such plugging, fouling, or contamination of a gas inlet aperture associated with an ion source. Thus, in accordance with one example aspect of the disclosure, FIG. 3 illustrates an example ion source 300, wherein an arc chamber 302 is provided having one or more radiation generating features 304 defined therein. The arc chamber 302 comprises an arc chamber body 306 that generally encloses or otherwise defines an internal volume 308. The one or more radiation generating features 304, for example, comprise one or more of a cathode 310, a repeller 312 (also called an anti-cathode), a wall 314 of the arc chamber 302, an arc slit 316, and a plasma column 318 defined within the internal volume 308 during operation of the ion source 300. The arc slit 316 is illustrated in phantom and defined in an arc slit plate (not shown for clarity) that generally encloses the internal volume 318.

The arc chamber body 306, for example, can further comprise one or more liners 320, wherein the one or more liners generally serve to thermally, chemically, or otherwise protect the arc chamber body 306. The one or more liners 320, for example, and can comprise or be comprised of a material such as a graphite or other protective material. In one example, the arc chamber 302 comprises at least one gas inlet aperture 322 for introduction of a gas from a gas source 324 to the internal volume 308, as will be discussed further, infra. The gas inlet aperture 322 (e.g., a hole, channel, or other opening), for example, is defined in or through one or more of the arc chamber body 306 and the one or more liners 320.

According to one example of the present disclosure, one or more shields 326 are positioned proximate to the gas inlet aperture 322, wherein the one or more shields provide a fluid communication between the gas inlet aperture and the internal volume 308 while shielding the gas inlet aperture from thermal radiation associated with the internal volume. The one or more shields 326 illustrated in FIG. 3, for example, are configured to substantially limit thermal radiation associated with the plasma column 318 or others of the one or more radiation generating features 304 from reaching the gas inlet aperture 322. In one example, the one or more shields 326 are operably coupled to one or more of the arc chamber body 306 and the one or more liners 320 via one or more fastening devices 328. In the present example, the one or more fastening devices 328 comprise one or more screws 330 and/or one or more standoffs 332, whereby the one or more shields 326 are selectively positioned with respect to the arc chamber body 306 via the one or more fastening devices. The one or more shields 326, for example, substantially diminish or prevent a line-of-sight from the one or more radiation generating features 304 (e.g., the plasma column 318) to the gas inlet aperture 322, and are contemplated as having various configurations. For example, the one or more shields 326 are contemplated as being of wide variety of size and shape, such as one or more of rectangular, ovular, circular, or irregular in shape.

The one or more shields 326, for example, are configured to not substantially interfere with the plasma column 318 within the arc chamber 302. For example, the one or more shields 326 comprise shields 334A, 334B, and 334C shown in FIG. 3, whereby the innermost shield 334A has the greatest direct exposure to the plasma column 318. As such, the configuration of at least the innermost shield 334A, for example, is provided such that it is generally symmetric with respect to the arc slit 316 and generally provides symmetry within the internal volume 308. The innermost shield 334A, for example, can be thus positioned within the arc chamber 302 such that its position with respect to one or more of the cathode 310, repeller 312, liners 320 and arc slit 316 does not substantially interfere with the formation of the plasma column 318. The innermost shield 334A, for example, can be is substantially coplanar with, or slightly recessed from, an interior surface 336 (e.g., a surface of the one or more liners 320) of a sidewall 338 of the arc chamber 302 that is associated with the gas inlet aperture 322. While the innermost shield 334A is illustrated in the present example as extending partially along the sidewall 338 of the arc chamber 302, the present disclosure further contemplates at least one (e.g., the innermost shield 334A) of the one or more shields 326 extending approximately fully between end sidewalls 340 of the arc chamber 302 with the cathode 310 and repeller 312. In the example illustrated in FIG. 3, the one or more shields 326 are substantially uniform in size and shape.

Figure 4:
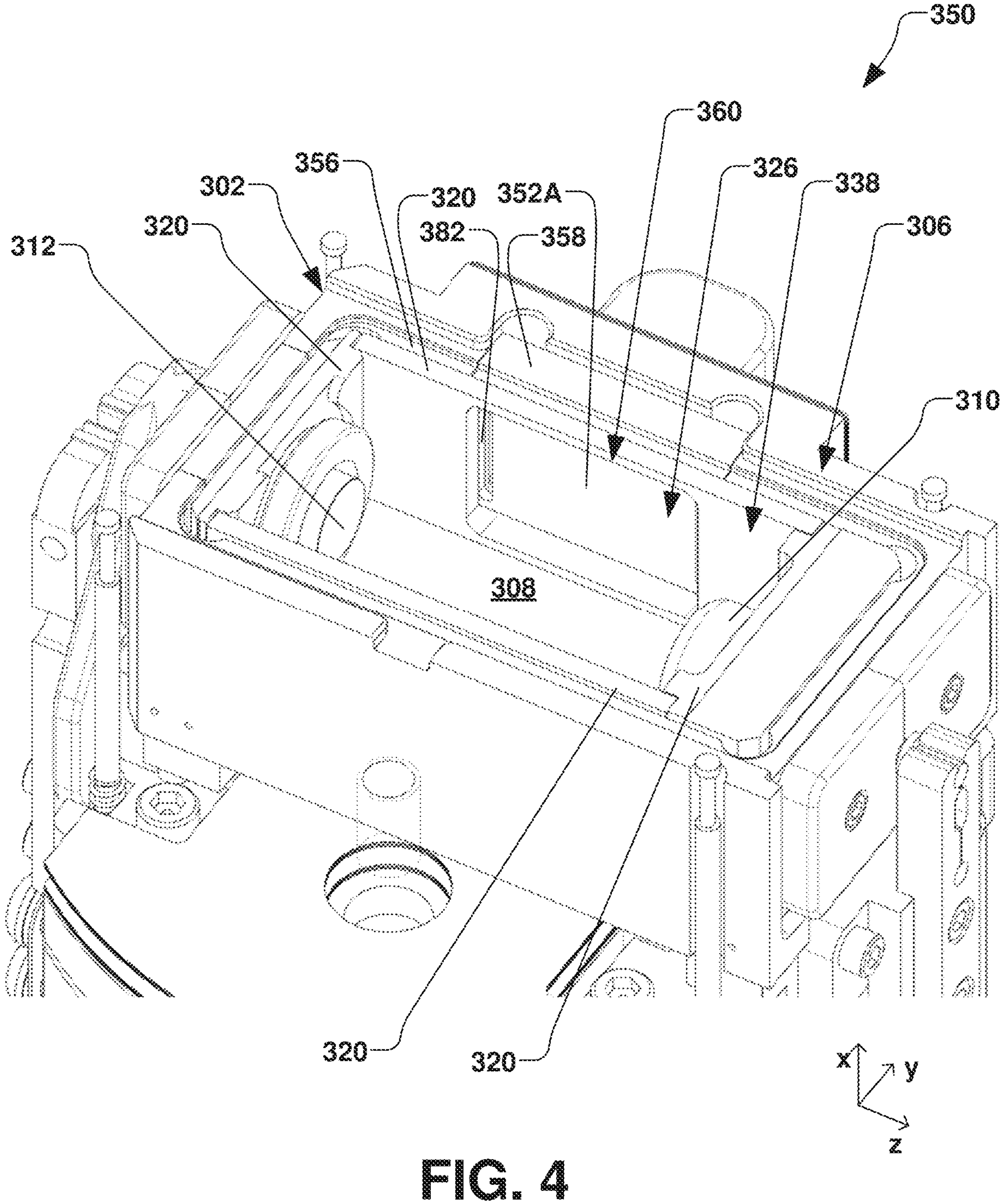
FIG. 4 is a perspective view of an example arc chamber in accordance with various examples of the present disclosure.
Figure 5:
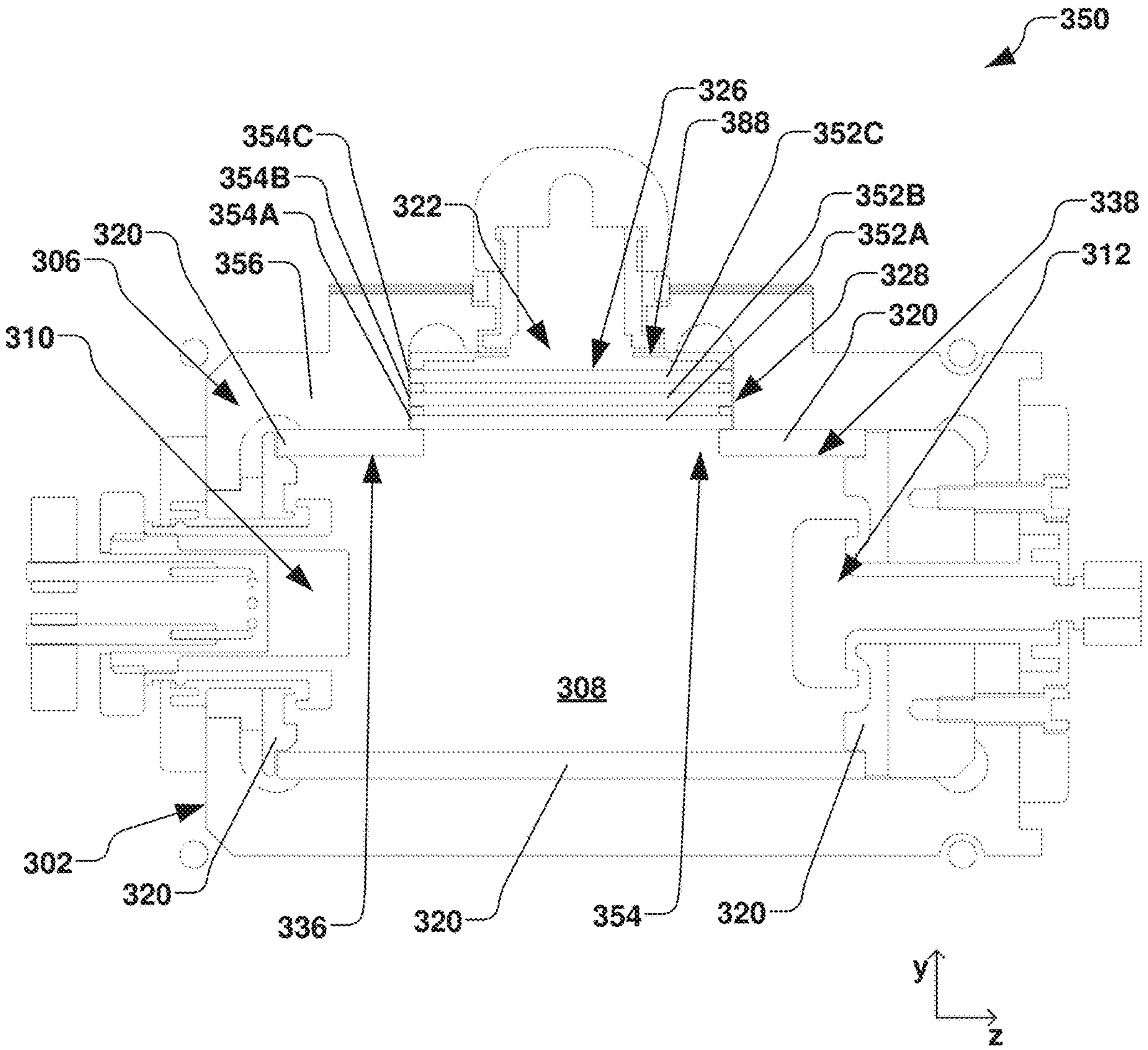
FIG. 5 is a partial cross-sectional view of the example arc chamber of FIG. 4 in accordance with various examples of the present disclosure.

For example, FIGS. 4-5 illustrate another example arc chamber 350, whereby the one or more shields 326 comprise shield plates 352A-352C configured to slidingly engage one or more of the arc chamber body 306 and the one or more liners 320. For example, the shield plates 352A-352C of FIG. 5, for example, slidingly engage slots 354A-354C defined in a side member 356 (e.g., one of the one or more liners 320 or arc chamber body 306), and a cover member 358 shown in FIG. 4 is operably coupled to the side member to selectively secure the shield plates in place. As such, the sliding engagement between the respective shield plates 352A-352C and slots 354A-354C, along with the cover member 358 generally define the one or more fastening devices 328. In the present example, the innermost shield plate 352A, for example, is slightly recessed from the interior surface 336 of the sidewall 338 of the arc chamber 302, thus again providing general symmetry of the internal volume 308. The sidewall 338 of the arc chamber 302 further defines an exposure aperture 360 that exposes at least an innermost shield plate 352A to the internal volume 308.

The present disclosure thus appreciates, that while here may be operational advantages to generally providing symmetry of the interior volume 308 associated with the one or more shields 326 and the arc chamber 302, such as illustrated in the examples shown in FIGS. 3-5, various other configurations of the one or more shields are contemplated as falling within the scope of the present disclosure. In accordance with another example illustrated in FIG. 6, another arc chamber 370 is illustrated whereby the one or more shields 326 comprise a plurality of shields 372A-372C having varying geometries, whereby the plurality of shields are illustrated as being generally stepped with respect to the gas inlet aperture 322. The plurality of shields 372A-372C, for example, can be symmetric to the plasma column 318, or offset from the plasma column or be otherwise asymmetric with respect to the arc chamber 302.

Referring again to FIG. 3, in accordance with another example aspect of the disclosure, the gas source 324 is configured to provide a gas (e.g., a process gas, co-gas, or other gas) to or through the gas inlet aperture 322 via one or more conduits 374 selectively fluidly coupled to the gas source and gas inlet aperture. It should be further noted that while the gas inlet aperture 322 is described as being a single aperture in one example, multiple apertures, holes, or channels are also contemplated, whereby the one or more conduits 374 are configured to selectively supply the gas thereto.

During operation any of the arc chambers 302, 350, 370 of FIGS. 3-6, for example, a gas inlet temperature is defined at the gas inlet aperture 322, wherein the one or more shields 326 are further configured to maintain the gas inlet temperature below a predetermined maximum temperature. The predetermined maximum temperature, for example, can be based on, or associated with, a decomposition temperature of the gas at which the gas begins to substantially decompose due to such an elevated temperature. In one example, the gas comprises dimethylaluminum chloride (DMAC), and the predetermined maximum temperature is approximately 400 C. As such, a predetermined configuration of a number, size, shape, thickness, position along the sidewall 338 or other feature associated with the one or more shields 326 can be advantageously provided based on the predetermined maximum temperature associated with the gas. Further, the predetermined configuration of the one or more shields 326 can be based on a desired flow rate of the gas from the gas inlet aperture 322 to the internal volume 308. As such, a predetermined spacing or flow path of the gas between or through the one or more shields 326 can be provided to yield the desire flow rate of the gas from the gas inlet aperture 322 to the internal volume 308.

According to another example, the one or more shields 326 are further configured to generally prevent a formation of a plasma at, or proximate to, the gas inlet aperture 322. For example, at least one of the one or more shields 326 can be positioned directly over the gas inlet aperture 322 of any of FIGS. 3, 5, and 6, while not contacting the gas inlet aperture. The one or more shields 326, for example, can comprise one or more rigid plates 380, as illustrated in FIG. 7. The one or more rigid plates 380, for example, can be comprised of one or more of one or more a refractory material, a ceramic, and graphite. The one or more rigid plates 380, for example are generally planar, as illustrated in FIG. 7, or may comprise a curved plate (not shown). The one or more shields 326, for example, can be further configured to conform to various features of the arc chamber, such as to the arc chamber body 306 of any of FIGS. 3-6. The one or more rigid plates 380, for example, are configured to be mounted in various positions with respect an innermost liner and the arc chamber body 306, such as described above. The one or more rigid plates 380, for example, can be spaced apart from each other by a predetermined spacing distance by the one or more fastening devices 328, whereby the gas described above can pass between the plates from the gas inlet aperture 322 to the internal volume 308 of the arc chamber body 306.

Figure 8:
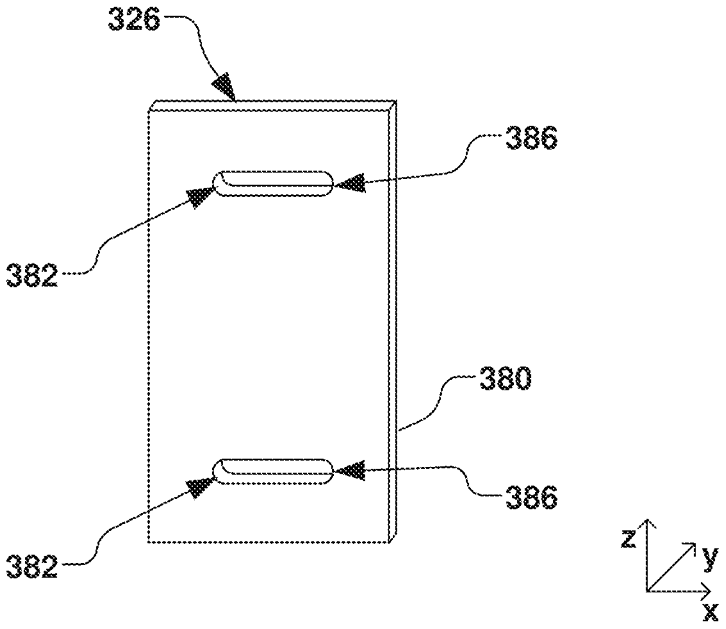
FIG. 8 illustrates a front perspective view of an example shields having a slot defined therein in accordance with an example of the present disclosure.

FIG. 8 illustrates another example, wherein one or more of the one or more shields 326 comprise one or more slot-shaped apertures 382 defined therein. The one or more slot-shaped apertures 382, for example, are further provided in the respective shield plates 352A-352C in the example arc chamber 350 as illustrated in FIGS. 4-5. While only shield plate 352A is visible in FIG. 4, shield plates 352B and 352C illustrated in FIG. 5 can have a similar configuration. Accordingly, the gas is configured to pass through each of the slot-shaped apertures 382 in the respective shield plates 352A-352C, while thermally protecting the gas inlet aperture 322 of FIG. 5 from exposure to the plasma formed within the internal volume 308 of the arc chamber body 306.

Figure 9A:
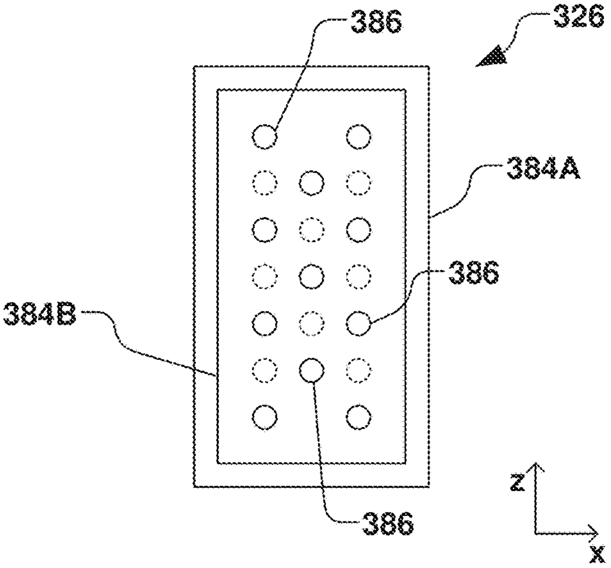
FIGS. 9A-9C illustrate front and rear views of an example plurality of shields having a plurality of offset holes defined therein in accordance with an example of the present disclosure.
Figure 9B:
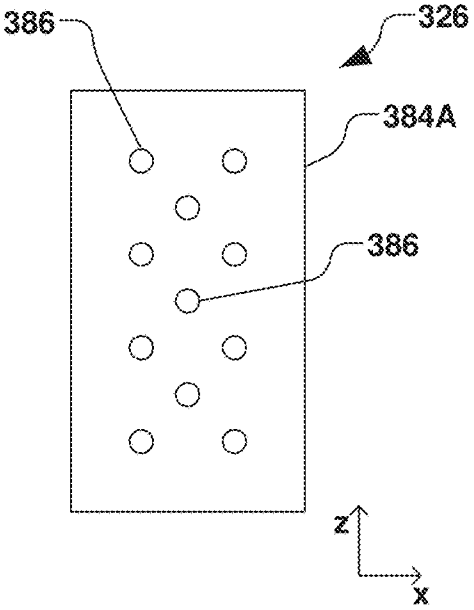
Figure 9C:
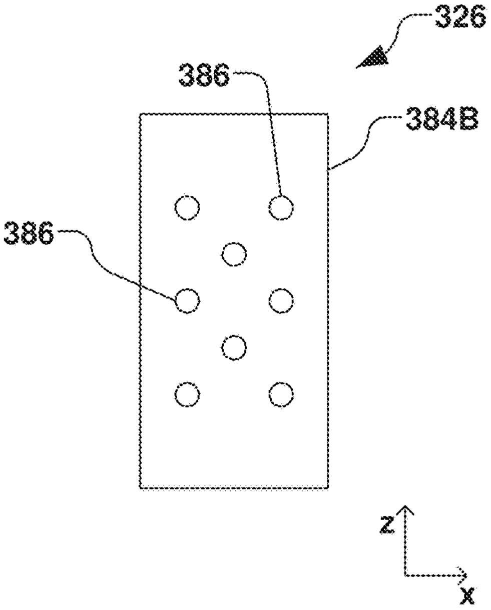

FIGS. 9A-9C illustrate another example, wherein the one or more shields 326 are comprised of a plurality of shields 384A, 384B, and wherein one or more of the plurality of shields have one or more shield apertures 386 defined therein. In FIG. 9A, the plurality of shields 384A, 384B are illustrated as would be installed in the ion source, whereby the shields are stacked and spaced apart in the y-direction, and whereby the plurality of apertures are offset from one another when viewed from the y-direction. The one or more shield apertures 386 are defined in the two or more of the plurality of shields 384A, 384B, for example, whereby the one or more shield apertures are offset from one another when the two or more of the plurality of shields are stacked upon one another to generally prevent line-of-sight between the plasma column 318 and the gas inlet aperture 322 shown in FIGS. 3 and 6. It shall be appreciated that the present disclosure contemplates the one or more shield apertures 386 taking any of a variety of shapes, such as circular as illustrated in FIGS. 9A-9C, slot-shaped as illustrated by the slot-shaped apertures 382 of FIG. 8, or other shapes, such as curvilinear, polygonal, maze-like, or other shapes not specifically illustrated, whereby the stacking of the two or more of the plurality of shields in combination with the configuration of the one or more shield apertures 386 generally prevents line-of-sight between the plasma column 318 or other radiation generating features 304 and the gas inlet aperture 322 shown in FIGS. 3 and 6.

Figure 6:
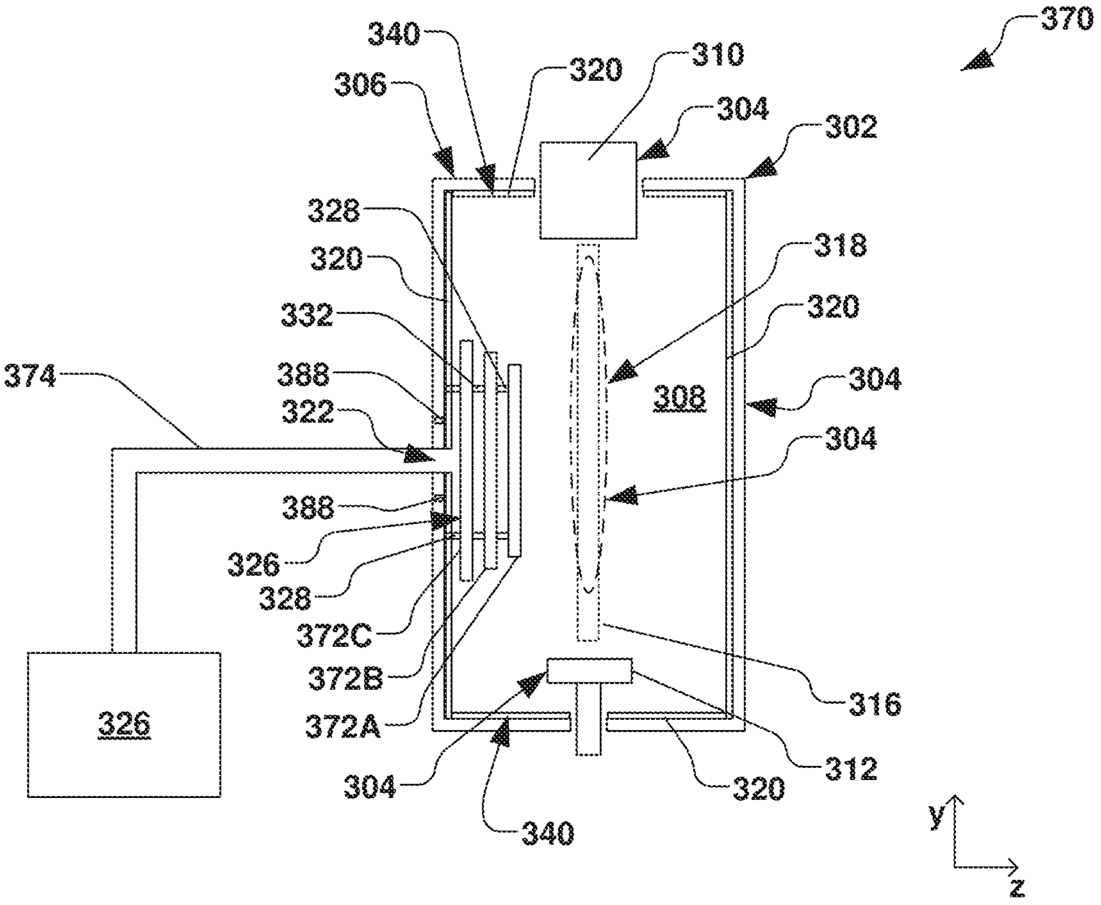
FIG. 6 is a schematic representation of another ion source in accordance with several example aspects of the present disclosure.
Figure 7:
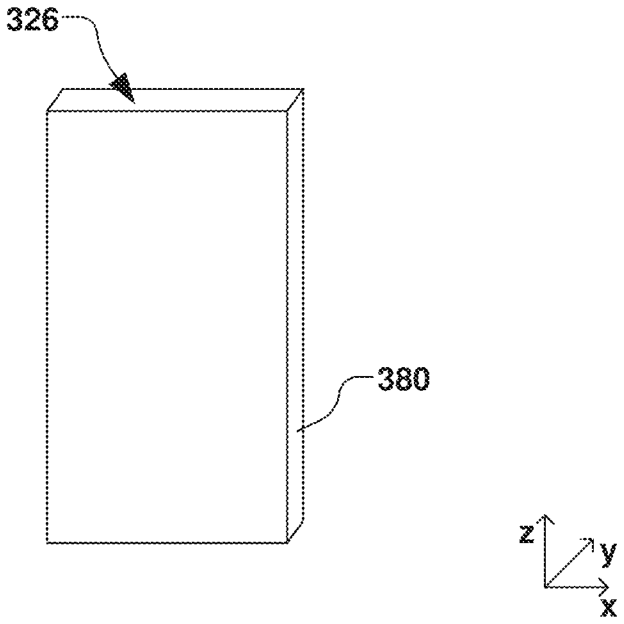
FIG. 7 illustrates a front perspective view of an example shields having no apertures defined therein in accordance with an example of the present disclosure.

According to another example, as illustrated in FIGS. 3 and 6, the one more liners 320 comprise one or more thermal breaks 388 defined therein, wherein the one or more thermal breaks are configured to reduce a heat transfer to the gas inlet aperture 322. The one more thermal breaks 388, for example, comprise one or more grooves defined in the one or more liners 320. Alternatively, or in addition, the one more thermal breaks 388, for example, comprise a region of the one or more liners 320 that has a smaller cross section (e.g., a thinning of cross-section) than a remainder of the one or more liners, as illustrated in the example of FIG. 5. For example, the one or more thermal breaks 388 can comprise a machined periphery defined around the gas inlet aperture 322, therein reducing a thermal conduction to the gas inlet aperture.

In accordance with another illustrative example of various aspects of the present disclosure, the ion source 300 of FIG. 3 is configured to form a plasma from a predetermined source material, wherein the one or more shields 326 are comprised of a predetermined material that is compatible with the source material, and wherein the one or more shields maintain a structural integrity when the plasma is formed. One of the one or more shields 326 (e.g., shield 334C) that is in closest proximity to the gas inlet aperture 322, for example, can have a lower melting temperature than a farthest one of the one or more shields (shield 334A, for example) that is farthest from the gas inlet aperture. In an example where the source material is a halide, the shield 334C can be comprised of a dopant metal or a ceramic containing the dopant, and one or more of the remaining shields (e.g., shields 334A, 334B) can be comprised of a refractory metal, a ceramic or graphite.

Accordingly, the present disclosure appreciates that by positioning the one or more shields 326 over, or in proximity to, the gas inlet aperture 322 (e.g., based on a temperature sensitivity of the source gas or molecule), a surface or area proximate to the gas inlet aperture is accordingly protected from heat associated with the plasma column 318, the cathode 310 (e.g., an indirectly heated cathode or IHC), the arc chamber body 306, or the repeller 312. The one or more shields 326, for example, also generally prevent the formation of a plasma at or proximate to the gas inlet aperture 322 due to localized high pressure in the region, thus lowering a temperature of the area or region surrounding the gas inlet aperture and/or preventing plasma intrusion into the inlet aperture. The one or more shields 326, for example, can comprise or be comprised of a refractory metal that has a low thermal conductivity, such as tantalum. Alternatively, the one or more shields 326 can comprise or be comprised of other various materials such as tungsten, molybdenum, graphite, aluminum nitride and aluminum oxide.

In accordance with another example, a configuration of the one or more shields 326 (e.g., a length, width, height, shape, etc.) can be based, at least in part, on the temperature sensitivity of the gas introduced to the ion source 300 via the gas inlet aperture 322. The one or more shields 326 can be planar or any non-planar shape, such as being curved or bell-shaped. In another example, a width and height of the one or more shields 326 may have a staggered or stepped configuration, such as to cover or generally prevent line-of-sight from the plasma column 318 to the gas inlet aperture 322.

The one or more shields 326, for example, are coupled to the arc chamber body 306 or one or more liners 320 via the one or more fastening devices 328, such as one or more screws, standoffs, clamps, interference-fit members, slots, etc. The one or more fastening devices 328, for example, comprise or are comprised of one or more of a refractory metal, ceramic or graphite, whereby the one or more fastening devices are configured to withstand high temperatures, reactive gases such as fluorine gas, and have low impurity levels. The one or more fastening devices 328, for example, are constructed from a material with low thermal conductivity, such as tantalum, whereby heat is not readily transferred to the arc chamber body 306 or the one or more liners 320.

In one example, the one or more liners 320 can be constructed such that two end pieces may be bridged together via one or more of the radiation shields. One or more of the one or more liners 320, for example, can comprise at least one thermal break 388 machined on, or otherwise defined in or on one or more sides of the gas inlet aperture 322. In another example, the thermal heat break 388 can be machined around the gas inlet aperture 322. The one or more liners 320 may also be thinned proximate to the gas inlet aperture 322 so as to further reduce mass and subsequent thermal conduction. While not shown, the one or more liners 320 can comprise a one-piece U-shaped liner (e.g., two side liners and a rear liner are combined to form the U-shaped liner), and one or more of the one or more shields 326 can be positioned over the gas inlet aperture 322. The one or more liners 320, for example, can be flat or shaped to follow various contours of a shield closest to the plasma. Various underlying U-shaped liners can be spaced apart to further reduce thermal conduction to the arc chamber body.

The present disclosure, for example, thus provides one or more thermal shields to reduce a temperature of various components in proximity to the gas inlet aperture and/or generally prevent the plasma from flowing to the region of the gas inlet aperture that can be an area of higher pressure than the remainder of the arc chamber. The present disclosure is thus particularly applicable when introducing various thermally-unstable stable gases to the arc chamber, such when introducing gases such as dimethylaluminum chloride (DMAC), Diborane, Halides or other such gases. DMAC, for example, can be utilized as a source of aluminum for implantation of aluminum ions in high power devices.

It is noted that the present disclosure is also applicable to various applications where highly-reactive gases are introduced to an arc chamber. In such applications, the present disclosure ameliorates concerns previously seen where high temperatures and highly-reactive gases are present, such as fluorine reacts with tungsten to form volatile $WF_x$. For example, highly-reactive gases such as such as fluorine, $XeF_2$, or other reactive gases can be provided through the gas inlet aperture, whereby the one or more shields of the present disclosure advantageously protect the region of the gas inlet aperture.

Figure 10:
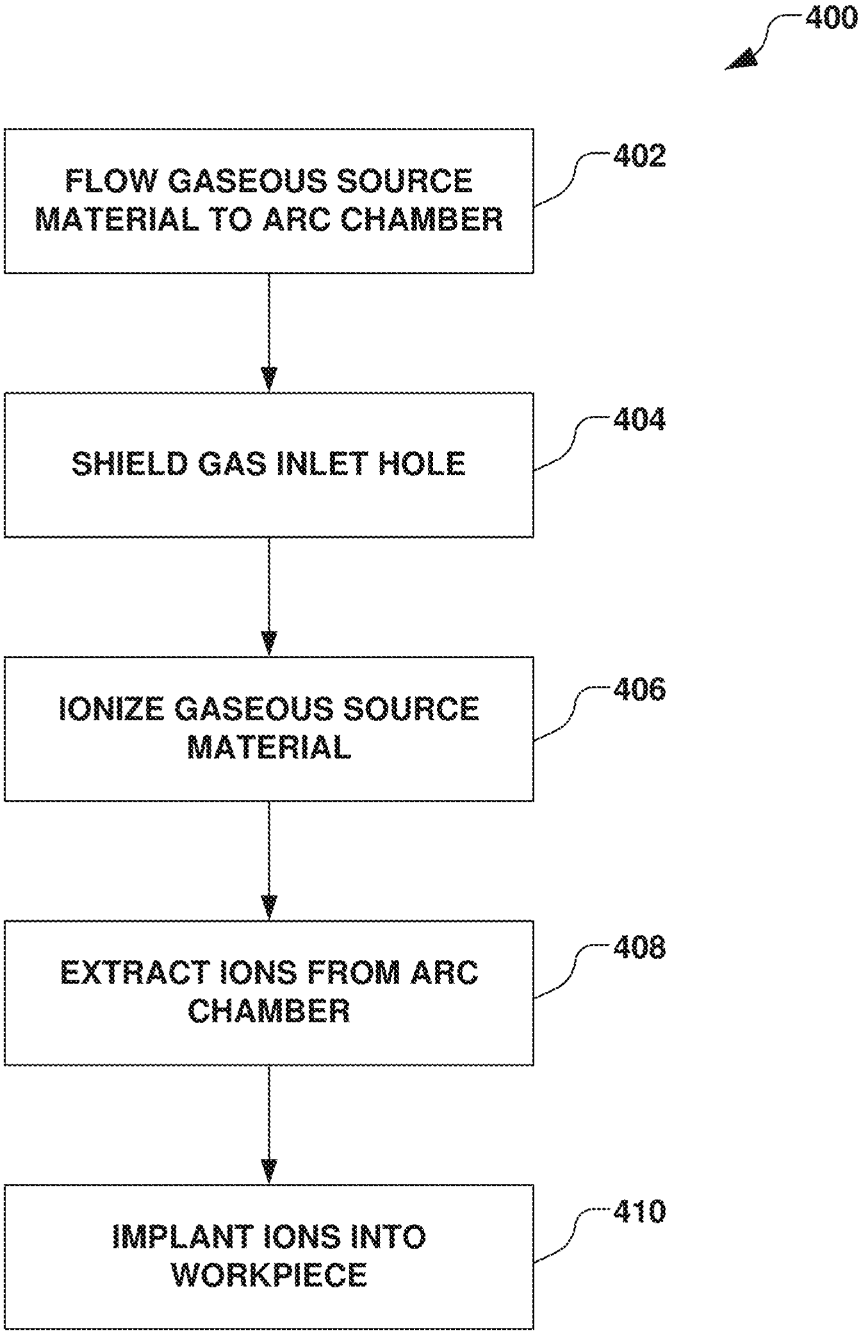
FIG. 10 illustrates an exemplary method for implanting aluminum ions into a workpiece using dimethylaluminum chloride as a gaseous ion source material.

FIG. 10 illustrates an exemplary method 400 for implanting aluminum ions into a workpiece. It should be further noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

In accordance with one exemplary aspect, in act 402 of FIG. 4, a gas is provided to an arc chamber of an ion source through a gas inlet aperture. The gas, in one example, can comprise a gaseous ion source material in the form of dimethylaluminum chloride (DMAC). The gaseous ion source material, for example, may be provided in low pressure bottle (e.g., approximately 10-15 torr), whereby the DMAC is flowed from the low-pressure bottle as a gas to the arc chamber through the gas inlet aperture. In act 404, the gas inlet aperture is shielded. For example, one or more shields are provided, as discussed above, in the arc chamber. In act 406, the ion source material is ionized in the ion source to produce ions. In act 408, the ions are extracted from the ion source to form an ion beam comprising the ions, and in act 410, the aluminum ions are implanted into a workpiece.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion source comprising:

an arc chamber having one or more radiation generating features defined therein, wherein the arc chamber comprises an arc chamber body generally enclosing an internal volume, and wherein the arc chamber body has a gas inlet aperture defined therein;

a gas source configured to provide a gas through the gas inlet aperture; and one or more shields positioned proximate to the gas inlet aperture, wherein the one or more shields provide a fluid communication between the gas inlet aperture and the internal volume, and wherein the one or more shields minimize a line-of-sight from the one or more radiation generating features to the gas inlet aperture and are configured to substantially prevent thermal radiation from reaching the gas inlet aperture from the one or more radiation generating features, wherein a gas inlet temperature is defined at the gas inlet aperture, and wherein the one or more shields are configured to maintain the gas inlet temperature below a predetermined maximum temperature, and wherein the predetermined maximum temperature is based on a decomposition temperature of the gas.

2. The ion source of claim 1, wherein the ion source is configured to form a plasma within the arc chamber from a source material comprising a dopant species, and wherein at least one shield of the one or more shields is comprised of a shield material that comprises the dopant species, wherein the shield material is configured to be chemically etched by the gas.

3. The ion source of claim 2, wherein the dopant species comprises aluminum, and wherein the gas comprises a halide.

4. The ion source of claim 2, wherein the one or more shields comprise a plurality of shields, and wherein the at least one shield comprises a closest one of the plurality of shields that is in closest proximity to the gas inlet aperture and is comprised of the dopant species, and wherein a farthest one of the plurality of shields that is farthest from the gas inlet aperture is comprised of a refractory metal, a ceramic, or graphite.

5. The ion source of claim 1, wherein the gas comprises dimethylaluminum chloride (DMAC).

6. The ion source of claim 1, wherein the one or more radiation generating features comprise one or more of a plasma column defined within the internal volume, a cathode, a repeller, the arc chamber body, and an arc slit plate.

7. The ion source of claim 6, wherein the one or more shields are configured to generally prevent the plasma column from forming a plasma at the gas inlet aperture.

8. The ion source of claim 1, wherein the one or more shields are symmetrically arranged with respect to the arc chamber body.

9. An ion source comprising:

an arc chamber having one or more radiation generating features defined therein, wherein the arc chamber comprises an arc chamber body generally enclosing an internal volume, and wherein the arc chamber body has a gas inlet aperture defined therein;

a gas source configured to provide a gas through the gas inlet aperture; and one or more shields positioned proximate to the gas inlet aperture, wherein the one or more shields comprise a plurality of rigid plates in a stacked formation, wherein the one or more shields provide a fluid communication between the gas inlet aperture and the internal volume, and wherein the one or more shields minimize a line-of-sight from the one or more radiation generating features to the gas inlet aperture and are configured to substantially prevent thermal radiation from reaching the gas inlet aperture from the one or more radiation generating features.

10. The ion source of claim 9, wherein the plurality of rigid plates are positioned directly over the gas inlet aperture while not contacting the gas inlet aperture.

11. The ion source of claim 10, wherein the arc chamber body comprises one or more liners, wherein the plurality of rigid plates are recessed behind an innermost liner and the arc chamber body.

12. The ion source of claim 11, wherein the plurality of rigid plates are spaced apart from each other by a predetermined spacing distance.

13. The ion source of claim 9, wherein the one or more shields are comprised of one or more of a refractory material, a ceramic, and graphite.

14. The ion source of claim 9, wherein one or more of the plurality of rigid plates have one or more shield apertures defined therein.

15. The ion source of claim 14, wherein at least one of the one or more shield apertures has a shape that is circular, slot-shaped, curvilinear, polygonal, or maze-like.

16. An ion source comprising:

an arc chamber having one or more radiation generating features defined therein, wherein the arc chamber comprises an arc chamber body generally enclosing an internal volume, and wherein the arc chamber body has a gas inlet aperture defined therein;

a gas source configured to provide a gas through the gas inlet aperture; and a plurality of shields positioned proximate to the gas inlet aperture, wherein one or more of the plurality of shields have one or more shield apertures defined therein, wherein the plurality of shields provide a fluid communication between the gas inlet aperture and the internal volume, and wherein the plurality of shields minimize a line-of-sight from the one or more radiation generating features to the gas inlet aperture and are configured to substantially prevent thermal radiation from reaching the gas inlet aperture from the one or more radiation generating features.

17. The ion source of claim 16, wherein the one or more shield apertures are defined in the two or more of the plurality of shields and are offset from one another, thereby preventing the line-of-sight from the one or more radiation generating features to the gas inlet aperture through the one or more shield apertures.

18. An ion source comprising:

an arc chamber having one or more radiation generating features defined therein, wherein the arc chamber comprises an arc chamber body generally enclosing an internal volume, wherein the arc chamber body comprises one or more liners, and wherein the arc chamber body has a gas inlet aperture defined therein;

a gas source configured to provide a gas through the gas inlet aperture; and one or more shields positioned proximate to the gas inlet aperture, wherein the one or more shields provide a fluid communication between the gas inlet aperture and the internal volume, and wherein the one or more shields minimize a line-of-sight from the one or more radiation generating features to the gas inlet aperture and are configured to substantially prevent thermal radiation from reaching the gas inlet aperture from the one or more radiation generating features, and wherein the one or more shields are operably coupled to the one or more liners.

19. The ion source of claim 18, wherein the one or more liners comprise one or more thermal breaks defined therein, wherein the one or more thermal breaks are configured to reduce a heat transfer to the gas inlet aperture.

20. The ion source of claim 19, wherein the one or more thermal breaks comprise one or more of a groove defined in the one or more liners, a region of the one or more liners that has a smaller cross section than a remainder of the one or more liners, and a machined periphery defined around the gas inlet aperture configured to limit a thermal conduction through the one or more liners to the gas inlet aperture.

21. The ion source of claim 18, further comprising one or more fastening devices, wherein the one or more fastening devices operably couple the one or more shields to one or more of the arc chamber body and the one or more liners.

22. The ion source of claim 21, wherein the one or more fastening devices comprise one or more screws and/or one or more standoffs.

23. The ion source of claim 18, further comprising a plurality of slots defined in the one or more liners, wherein the one or more shields are configured to slidingly engage the plurality of slots, thereby operably coupling the one or more shields to the one or more liners.

24. An ion source comprising:

an arc chamber configured to form a plasma column;

a gas inlet aperture defined in a wall of the arc chamber;

one or more shields, wherein the one or more shields generally prevent a line of sight from the plasma column to the gas inlet aperture, and wherein the one or more shields generally define one or more walls of the arc chamber; and a cathode and a repeller respectively positioned at opposite ends of the arc chamber, wherein the arc chamber is symmetrical, and whereby the one or more shields are configured to provide a uniform erosion of the cathode and repeller.

25. The ion source of claim 24, wherein the one or more shields are configured to lower a temperature proximate to the gas inlet aperture concurrent with the formation of the plasma column.

26. The ion source of claim 24, wherein the one or more shields further minimizes a decomposition and/or plugging of the gas inlet aperture concurrent with the formation of the plasma column.

27. The ion source of claim 24, wherein one or more of a size, a shape, and a quantity of the one or more shields is configured to prevent the line of sight from the plasma column to the gas inlet aperture based, at least in part, on a temperature sensitivity of a gas provided through the gas inlet aperture.

28. The ion source of claim 24, wherein the one or more shields are configured to reduce a temperature of the arc chamber concurrent with the formation of the plasma column.

29. The ion source of claim 24, wherein the one or more shields comprise a plurality of shields, and wherein at least one of the plurality of shields has one or more shield apertures defined therein.

* * * * *